United States Patent
Hoshi et al.

(10) Patent No.: US 6,632,280 B2
(45) Date of Patent: Oct. 14, 2003

(54) APPARATUS FOR GROWING SINGLE CRYSTAL, METHOD FOR PRODUCING SINGLE CRYSTAL UTILIZING THE APPARATUS AND SINGLE CRYSTAL

(75) Inventors: Ryoji Hoshi, Fukushima (JP); Koji Kitagawa, Fukushima (JP); Izumi Fusegawa, Fukushima (JP); Tomohiko Ohta, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 74 days.

(21) Appl. No.: 09/937,132
(22) PCT Filed: Jan. 25, 2001
(86) PCT No.: PCT/JP01/00494
§ 371 (c)(1), (2), (4) Date: Sep. 21, 2001
(87) PCT Pub. No.: WO01/57293
PCT Pub. Date: Aug. 9, 2001

(65) Prior Publication Data
US 2003/0070605 A1 Apr. 17, 2003

(30) Foreign Application Priority Data
Jan. 31, 2000 (JP) .................................. 2000-021241

(51) Int. Cl.[7] .............................................. C30B 15/00
(52) U.S. Cl. ..................... 117/217; 117/208; 117/218; 117/222
(58) Field of Search .............................. 117/208, 217, 117/218, 222

(56) References Cited

U.S. PATENT DOCUMENTS 5,567,399 A * 10/1996 Von Ammon et al.
6,287,382 B1 * 9/2001 Cherko .................... 117/208

FOREIGN PATENT DOCUMENTS

| JP | A 61-68389 | 4/1986 |
| JP | A 1-145391 | 6/1989 |
| JP | A 2-97480 | 4/1990 |
| JP | A 6-199590 | 7/1994 |
| JP | A 6-211589 | 8/1994 |
| JP | A 8-239291 | 9/1996 |
| JP | 2000-263165 | * 3/2002 |
| WO | WO 97/21853 | 6/1997 |

OTHER PUBLICATIONS

Nicodeme et al., "Global modeling of heat transfer in crystal growth furnaces", Int. J. Heat Mass Transfer, vol. 33, No. 9, pp. 1849–1871, 1990.

* cited by examiner

Primary Examiner—Felisa Hiteshew
(74) Attorney, Agent, or Firm—Oliff & Berridge, PLC

(57) ABSTRACT

An apparatus for growing a single crystal (20) comprising at least a main chamber (1) enclosing a crucible (5, 6) for accommodating a raw material melt (4) and a heater (7) for heating the raw material melt and a pulling chamber (2) continuously provided above the main chamber, into which a grown single crystal is pulled and stored, wherein the apparatus further comprises a cooling cylinder (11) that extends at least from a ceiling of the main chamber toward a raw material melt surface so as to surround a single crystal under pulling (3) and is forcibly cooled with a cooling medium, and an auxiliary cooling member (13) extending below the cooling cylinder and having a cylindrical shape or a shape tapered toward the downward direction. There is provided an apparatus for growing a single crystal that can exert cooling effect on a grown single crystal to the maximum extent so as to accelerate the crystal growth rate and safely produce a single crystal without leakage of cooling medium due to breakage etc.

15 Claims, 5 Drawing Sheets

APPARATUS FOR GROWING SINGLE CRYSTAL, METHOD FOR PRODUCING SINGLE CRYSTAL UTILIZING THE APPARATUS AND SINGLE CRYSTAL

TECHNICAL FIELD

The present invention relates to an apparatus for growing a single crystal used for production of single crystals such as silicon single crystals by the Czochralski method (also referred to as the "CZ method" or "pulling method" hereinafter), a production method and a single crystal.

BACKGROUND ART

Hereafter, conventional art relating to the present invention will be explained by exemplifying growing of a silicon single crystal.

An apparatus for growing a single crystal used for producing a silicon single crystal by the CZ method generally comprises a crucible accommodating a raw material melt, which can be moved upwardly and downwardly, and a heater disposed so as to surround the crucible, both of which are provided in a main chamber for growing a single crystal, and a pulling chamber for accommodating and taking out a grown single crystal is continuously provided above the main chamber. When a single crystal is produced by using such an apparatus for growing a single crystal, a seed crystal is immersed in the raw material melt and carefully pulled upwardly with rotation to grow a rod-like single crystal, while the crucible is moved upwardly according to the growth of the crystal so that the melt surface should be always maintained at a constant height in order to obtain desired crystal quality.

Further, when the single crystal is grown, the seed crystal attached to a seed holder is immersed in the raw material melt, and then the seed crystal is pulled upwardly with rotation in a desired direction by carefully winding up a wire by means of a pulling mechanism to grow a single crystal ingot at the end of the seed crystal. In this case, in order to eliminate dislocations produced when the seed crystal is brought into contact with the melt, the crystal in an early stage of the growth is once made thin to a small diameter of about 3 to 5 mm, and then the diameter is increased after the dislocation are eliminated so as to grow a single crystal ingot of desired quality.

At this time, the pulling rate for a portion having a constant diameter of the single crystal ingot is usually extremely slow, i.e., about 0.5 to 1 mm/min, and if it is pulled fast by constraint, there arisen problems, for example, the growing single crystal is deformed and thus a cylindrical product having a constant diameter can no longer be obtained, slip dislocations are generated in the single crystal ingot, the crystal is detached from the melt and thus it cannot be a product and so forth. Therefore, increase of the crystal growing rate is limited.

However, for the purpose of improving productivity and reducing cost in the production of single crystal ingots by the aforementioned CZ method, increase of the single crystal growth rate is one of considerable means, and various improvement have hitherto been made to achieve increase of the single crystal growth rate.

The pulling rate, i.e., the single crystal growth rate is determined by the heat balance of the growing crystal. The heat quantity incorporated into the crystal consists of inflow heat quantity from the melt and the heater and solidification latent heat generated when the melt crystallizes. When the heat balance of the growing crystal is considered, it is necessary that outflow heat quantity emitted out of the crystal from the crystal surface and the seed crystal should be equal to the sum of the inflow heat quantity and the solidification latent heat. The solidification latent heat depends on the volume of the crystal growing per unit time. Therefore, in order to increase the crystal growth rate, it is necessary to compensate increase of solidification latent heat provided by increase of the crystal growth rate by reducing the inflow heat quantity or increasing the outflow heat quantity.

Therefore, it is generally used a method of efficiently removing heat emitted from the crystal surface to increase the outflow heat quantity.

As one of such means, there was proposed apparatus in which the pulling rate is increased by providing cooling means in the main chamber so as to surround a single crystal ingot under pulling and thereby efficiently cooling the single crystal ingot under pulling. For example, there is the apparatus disclosed in Japanese Patent Laid-open (Kokai) Publication No. 6-211589. In this apparatus, a gas flow guide cooling cylinder having a double structure consisting of an outer cooling cylinder composed of metal and an inner cooling cylinder composed of graphite or the like is provided from the bottom portion of the pulling chamber to the inside of main chamber so as to concentrically surround a single crystal ingot under pulling and thereby heat generated in the inner cooling cylinder is transferred to the outside by the outer cooling cylinder, so that temperature increase of the inner cooling cylinder should be suppressed and cooling efficiency of the crystal should be improved.

Apparatuses utilizing cooling medium such as water in order to more efficiently cool a growing single crystal are also disclosed. For example, in the apparatus for growing a single crystal disclosed in Japanese Patent Laid-open (Kokai) Publication No. 8-239291, a cooling duct for circulating a liquid refrigerant is provided in a main chamber and a cooling member composed of a material having high heat conductivity such as silver is provided below the duct so as to rapidly transfer heat emitted from crystal surface to the outside and thereby attain effective cooling of crystal. However, if fluid such as water generally used as the cooling medium approaches the melt surface heated to a high temperature exceeding 1000° C., it may be a cause of phreatic explosion and thus dangerous. Therefore, in this apparatus, safety is secured by separating the cooling duct from the melt surface.

In these apparatuses, for example, in the aforementioned apparatus disclosed in Japanese Patent Laid-open (Kokai) Publication No. 6-211589, the outer cooling cylinder composed of metal and the inner cooling cylinder composed of graphite or the like in the double structure of the cooling cylinder show a difference in coefficient of thermal expansion and they are impossible to be always in perfect contact with each other. As for the disclosed apparatus, it is described that the diameter is made gradually smaller toward the downward direction so as to secure a larger contact area. However, even in such a case, they are actually contacted in a line and perfect contact cannot be obtained. Therefore, in an actual practice, a gap is formed between the outer cooling cylinder and the inner cooling cylinder and it acts as a heat insulating layer. Furthermore, there exists contact thermal resistance between the outer cooling cylinder and the inner cooling cylinder. This contact thermal resistance depends on type of material and surface condition, and it cannot be easily determined. However, in the structure used in the disclosed apparatus, the inner cooling cylinder cannot be cooled sufficiently and thus there is a problem that it is still impossible to exert significant crystal cooling effect.

On the other hand, as for the apparatus for growing a single crystal disclosed in Japanese Patent Laid-open (Kokai) Publication No. 8-239291, the cooling duct and the melt surface are separated and thus attention is paid for safety. However, in such a structure, the whole cooling duct is disposed at approximate center of the inside of the main chamber, and it causes problems concerning workability and operability in practical use. Further, it is difficult to secure sufficient strength of the duct due to its structure, and it is expected that the risk of leakage of liquid refrigerant due to breakage of the duct would increase.

Furthermore, there is an area between the cooling duct and the pulling chamber where the crystal is not sufficiently cooled. Therefore, the apparatus cannot always provide efficient removal of the outflow heat quantity emitted from the crystal, and it cannot be considered sufficient for obtaining significant cooling effect.

DISCLOSURE OF THE INVENTION

In view of the aforementioned problems, an object of the present invention is to provide an apparatus for growing a single crystal that can exert cooling effect on a grown single crystal to the maximum extent so as to accelerate the crystal growth rate and safely produce a single crystal without leakage of cooling medium due to breakage, melt down etc., as well as a method for producing a single crystal utilizing such an apparatus and a single crystal produced by utilizing such an apparatus.

In order to attain the aforementioned object, the apparatus for growing a single crystal of the present invention is an apparatus for growing a single crystal comprising at least a main chamber enclosing a crucible for accommodating a raw material melt and a heater for heating the raw material melt and a pulling chamber continuously provided above the main chamber, into which a grown single crystal is pulled and stored, wherein the apparatus further comprises a cooling cylinder that extends at least from a ceiling of the main chamber toward a raw material melt surface so as to surround a single crystal under pulling and is forcibly cooled with a cooling medium, and an auxiliary cooling member extending below the cooling cylinder and having a cylindrical shape or a shape tapered toward the downward direction.

If a cooling cylinder that is forcibly cooled with a cooling medium, and an auxiliary cooling member that downwardly extends from the cooling cylinder are provided as described above, the heat radiation from the heater is shielded by the auxiliary cooling member so that the single crystal at an extremely high temperature pulled from the raw material melt is gradually cooled and further effectively cooled by the cooling cylinder as it moves upwardly. As a result, it becomes possible to increase the growth rate of the crystal. In particular, the structure where the cooling cylinder that extends from the ceiling of the main chamber toward the raw material melt surface is forcibly cooed with a cooling medium improves the cooling capacity and enables cooling of crystal by effectively utilizing the space in the upper part of the main chamber. Therefore, it becomes possible to use a longer region where the crystal can be forcibly cooled and thus higher crystal cooling effect can be obtained.

Further, since the cooling cylinder is separated from the melt surface at an extremely high temperature by a sufficient distance, the melt would not be brought into contact with the cooling cylinder due to scattering of melt caused during the melting operation of the raw material or caused by rarely happening earthquake or the like and thus breakage or melt down thereof is not caused. Therefore, a single crystal can be grown very safely.

In the apparatus for growing a single crystal according to the present invention, the aforementioned cooling cylinder is preferably composed of iron, nickel, chromium, copper, titanium, molybdenum, tungsten or an alloy containing any one of these metals, or any of the aforementioned metals and alloy coated with titanium, molybdenum, tungsten or a platinum group metal.

The aforementioned metals are excellent in heat resistance and heat conductivity. Therefore, if these metals are used for the apparatus of the present invention, it can absorb the radiant heat from the heater and the melt surface and efficiently transfer it to the cooling medium such as water.

Further, the aforementioned auxiliary cooling member preferably consists of graphite, molybdenum or tungsten.

These materials are extremely excellent in heat resistance, and therefore they can effectively shield the radiant heat from the melt and the heater and are also suitable for cooling a single crystal ingot at an extremely high temperature immediately after the pulling from the melt surface. Further, if the auxiliary cooling member is constituted with such materials, it can be an auxiliary member also excellent in durability, and it is scarcely deformed or suffers from distortion at a high temperature. Therefore, it can be used for a long period of time, and because of its high mechanical strength, the handling at the time of dismounting or cleaning of the apparatus for growing a single crystal is concurrently becomes easy and workability is also improved.

Furthermore, a heat-shielding member is preferably provided to the aforementioned auxiliary cooling member.

If a heat-shielding member is provided to the auxiliary cooling member as described above, the radiant heat from the heater and the melt can be more effectively shielded, and as a result, the crystal growth rate can be further improved.

The end of the aforementioned cooling cylinder is preferably separated from the surface of the raw material melt contained in the crucible by 10 cm or more.

If the cooling cylinder is disposed with a predetermined distance from the raw material melt surface as described above, the risk of adhesion of the melt to the cooling cylinder should be substantially eliminated, and therefore a single crystal can be grown more safely. Further, by providing a distance of 10 cm or more between the melt surface and the lower end of the cooling cylinder, a fusion ring at a growing position of the crystal can be easily observed from the outside of the apparatus without any particular processing of the cooling cylinder, and it is sufficient to provide the auxiliary cooling member that can be easily processed with a detection window for control of crystal diameter and so forth. Therefore, the apparatus is simplified and it becomes possible to perform stable operation.

A protection member consisting of graphite or metal is preferably provided outside the aforementioned cooling cylinder.

By providing a protection member having heat resistance outside the cooling cylinder, adhesion of the melt scattered during the melting operation of the raw material and so forth to the cooling cylinder or deposition of material vaporized from the raw material melt during the operation on the surface of the cooling cylinder can be suppressed. This makes it possible to perform stable operation for a long period of time. Further, the radiant heat from the heater and the raw material melt surface can also be prevented from directly irradiating the cooling cylinder, and therefore it becomes possible to obtain further effective cooling effect.

Furthermore, the inner surface of the cooling cylinder is desirably subjected to a blackening treatment.

By subjecting the inner surface of the cooling cylinder to a blackening treatment such as application or vapor deposition of graphite or the like, absorption efficiency for the heat radiated from the crystal can be further improved. Increase of heat absorption efficiency of the cooling cylinder provided by the blackening treatment can realize faster crystal growth.

According to the present invention, there is further provided a method for producing a single crystal wherein a single crystal is grown by using the aforementioned apparatus for growing a single crystal, and a single crystal wherein it is grown by using the aforementioned apparatus for growing a single crystal.

By using the apparatus for growing a single crystal according to the present invention, a cylindrical silicon single crystal can be safely grown at a higher crystal growth rate without deformation of the crystal. Therefore, it also becomes possible to reduce the production cost as a result.

As explained above, the apparatus for growing a single crystal of the present invention comprises the cooling cylinder that extends at least from the ceiling of the main chamber toward a raw material melt surface so as to surround a single crystal under pulling and is forcibly cooed with a cooling medium, and the auxiliary cooling member extending below the cooling cylinder and having a cylindrical shape or a shape tapered toward the downward direction. By using the combination of such a cooling cylinder and auxiliary cooling member, cooling effect can be exerted to the maximum extent, and hence the pulling rate can be increased to dramatically increase the productivity of single crystal. Further, since the auxiliary cooling member not directly cooled by the cooling medium or the like is provided below the cooling cylinder, the cooling cylinder is protected without the risk of contact with the melt at an extremely high temperature, and thus safety is further secured.

BEST MODE FOR CARRYING OUT THE INVENTION

Hereafter, embodiments of the present invention will be explained by exemplifying growth of silicon single crystals with reference to the appended drawings. However, the present invention is not limited only to growth of these silicon single crystals. For example, the apparatus of the present invention can be also used for growth of other single crystals such as compound semiconductors.

Figure 1:
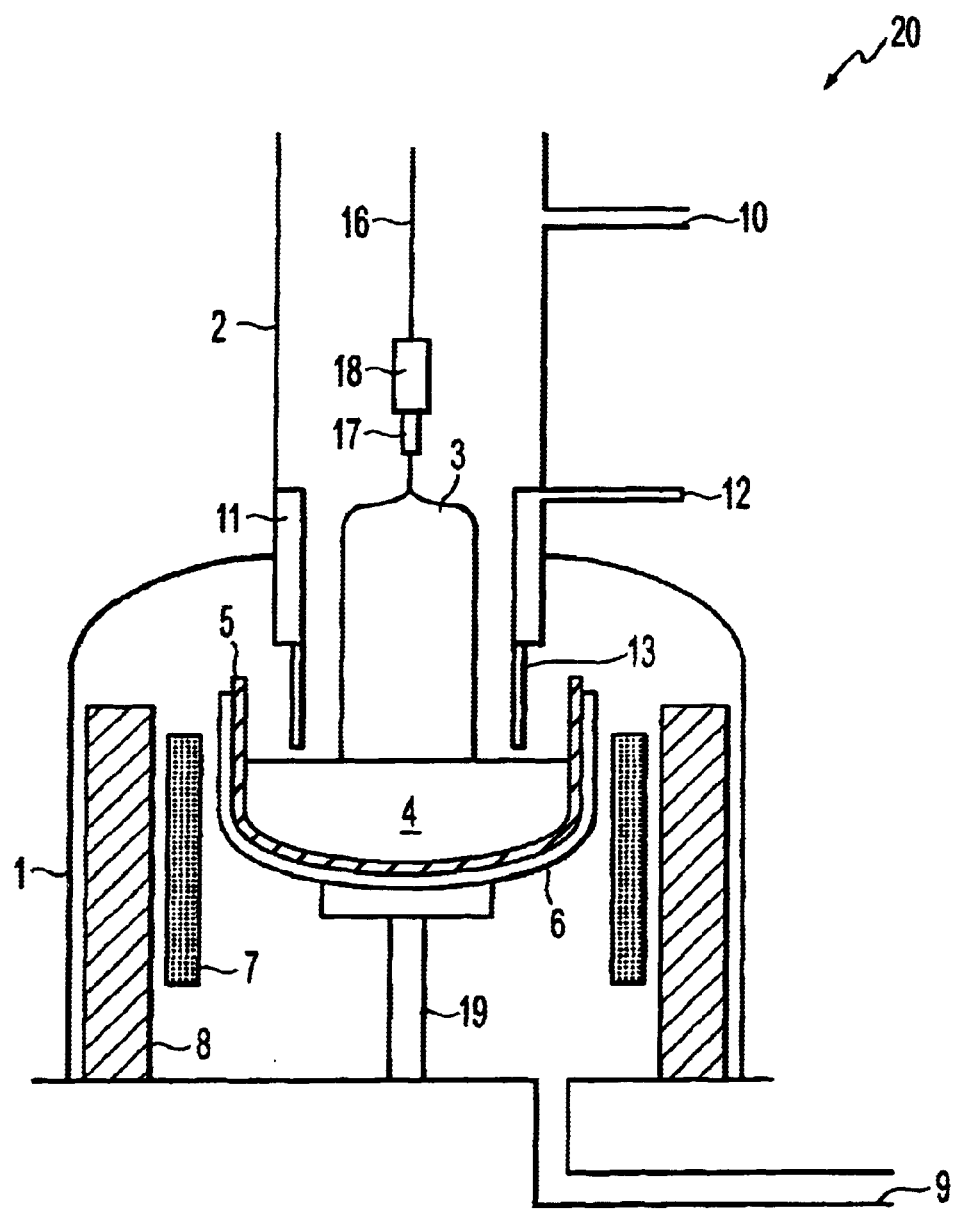
FIG. 1 is a sectional view showing a schematic structure of an exemplary apparatus for growing a single crystal according to the present invention.

FIG. 1 is a sectional view showing a schematic structure of an exemplary apparatus for growing a single crystal according to the present invention.

In the apparatus for growing a single crystal shown in FIG. 1, crucibles 5 and 6, which accommodate a raw material, for example, a raw material melt 4, a heater 7 for heating and melting a polycrystal silicon raw material and so forth are contained in a main chamber 1, and on a pulling chamber 2 continuously provided on the main chamber 1, a pulling mechanism (not shown) for pulling a grown single crystal is provided, as in ordinary apparatuses for growing a single crystal.

From the pulling mechanism provided above the pulling chamber 2, a pulling wire 16 is reeled out, and a seed holder 18 for attaching a seed crystal 17 is connected at the end of the wire. The seed crystal 17 attached at the end of the seed holder 18 is immersed in the raw material melt 4, and a single crystal ingot 3 is formed below the seed crystal 17 by winding the pulling wire 16 by the pulling mechanism.

The aforementioned crucibles 5 and 6 consist of an inside quartz crucible 5 for directly accommodating the raw material melt 4 and an outside graphite crucible 6 for supporting the quartz crucible 5. The crucibles 5 and 6 are supported by a crucible rotating shaft 19 that can be rotated and moved upwardly and downwardly by a rotation drive mechanism (not shown) provided at a lower portion of the apparatus for growing a single crystal 20. The crucibles are rotated in a direction reverse to the rotating direction of the crystal and moved upwardly for a height of melt surface lowered by decrease of the melt according to the pulling of a single crystal ingot 3, so that the height of the melt should be maintained constant, in order to prevent change of crystal quality owing to change of the melt surface in the apparatus for growing a single crystal.

The heater 7 is disposed so that it should surround the crucibles 5 and 6, and a heat insulating member 8 for preventing the heat from the heater 7 from directly radiating the main chamber is provided outside the heater 7 so that it should surround the heater.

Further, an inert gas such as argon gas is introduced into the chambers 1 and 2 from a gas inlet 10 provided at an upper part of the pulling chamber 2 with the purpose of discharging impurities generated in the furnace out of the furnace etc., passed through a space above the single crystal ingot 3 under pulling and the melt 4 to circulate inside the chambers 1 and 2, and then discharged from a gas outlet 9.

The main chamber 1 and the pulling chamber 2 are formed of a metal excellent in heat resistance and heat conductivity such as stainless steel, and cooled with water passing through cooling pipes (not shown).

One of characteristics of the apparatus for growing a single crystal according to the present invention is to comprise the cooling cylinder 11 extending at least from the ceiling of the main chamber 1 toward the raw material melt surface so as to surround the single crystal ingot 3 under pulling.

In this structure, the upper end of the cooling cylinder may be extended to the inside of the pulling chamber depending on the attachment status or the temperature distribution in the furnace.

Into the cooling cylinder 11 of the apparatus for growing a single crystal 20 shown in FIG. 1, a cooling medium is introduced from a cooling medium inlet 12, and the cooling medium circulates through the inside of the cooling cylinder 11 to forcibly cool the cooling cylinder 11, and then discharged outside.

Although any liquid or gas conventionally used as a cooling medium can be used as the cooling medium, it is suitable to use water in view of handling property, cost and so forth in addition to the cooling characteristics thereof. Further, by controlling flow rate and temperature of the cooling medium passing through the cooling cylinders 11 as required, the heat quantity of the cooling cylinder 11 to be removed can be changed, and therefore a desired cooling atmosphere according to the single crystal growth rate can be formed.

Although the material of the cooling cylinder 11 is not particularly limited so long as it is a material having heat resistance and excellent in heat conductivity, it can be specifically produced from iron, nickel, chromium, copper, titanium, molybdenum, tungsten or an alloy containing any of these metals. Further, the cooling cylinder may be constituted by the aforementioned metals or alloy coated with titanium, molybdenum, tungsten or a platinum metal.

If any of such metals and alloy as mentioned above is used, the cooling cylinder 11 has extremely excellent heat resistance and extremely high heat conductivity. Therefore, after absorbing heat emitted from the single crystal ingot, it efficiently transfer the heat to the cooling medium such as water circulating through inside of the cooling cylinder 11, and lowers the temperature around the crystal. Thus, the cooling rate of a single crystal can be improved.

As another characteristic, the apparatus for growing a single crystal according to the present invention comprises an auxiliary cooling member in a cylindrical shape or a shape tapered toward the downward direction.

In the apparatus for growing a single crystal 20 shown in FIG. 1, there is provided a cylindrical auxiliary cooling member 13 extending from the lower end of the cooling cylinder 11 to a position near the raw material melt surface. The auxiliary cooling member 13 surrounds the single crystal 3 at a high temperature immediately after the pulling, and exerting an effect of cooling the single crystal 3 by shielding the radiant heat from the heater 7 or the melt 4. Further, the cooling cylinder 11 is prevented from approaching a position immediately above the melt surface, and thus safety is secured. Simultaneously, it exerts an effect of guiding flow of inert gas flowing downwardly near the crystal from a space above the melt.

Material of the aforementioned auxiliary cooling member 13 is preferably one showing extremely excellent heat resistance and having high heat conductivity, and specifically, it is preferably composed of graphite, molybdenum or tungsten. In particular, graphite is suitable, since it efficiently shields radiant heat from the heater, melt or the like, and shows relatively high heat conductivity. Further, the member of which surface is coated with silicon carbide may also be used. If such a member is used, contamination by impurities from the auxiliary cooling member can be more favorably suppressed.

By using the auxiliary cooling member 13 consisting of a material showing excellent heat resistance and having high heat conductivity as described above, the heat absorbed by the auxiliary cooling member 13 is transferred to the cooling cylinder 11, and emitted to the outside via the cooling medium circulating through the inside of the cooling cylinder 11.

In the apparatus for growing a single crystal 20 according to the present invention described above, by providing the cooling cylinder 11 and the auxiliary cooling member 13 in combination as described above, the single crystal 3 at a extremely high temperature immediately after the growth from the melt 4 is first effectively cooled because the radiant heat from the heater 7 and so forth is shielded by the auxiliary cooling member 13. Then, as the single crystal 3 is further pulled, it faces the cooling cylinder 11 and cooled by the cooling cylinder 11 in a region reaching at least the ceiling of the main chamber 1, and therefore the crystal is cooled widely and efficiently. Accordingly, the outflow heat quantity from the crystal is surely removed and the cooling effect is exerted to the maximum extent. Thus, it becomes possible to pull the crystal at an extremely high growth rate.

Shape of the auxiliary cooling member of the apparatus for growing a single crystal according to the present invention is not limited to the aforementioned cylindrical shape, and it may have a shape tapered toward the downward direction.

Figure 2:
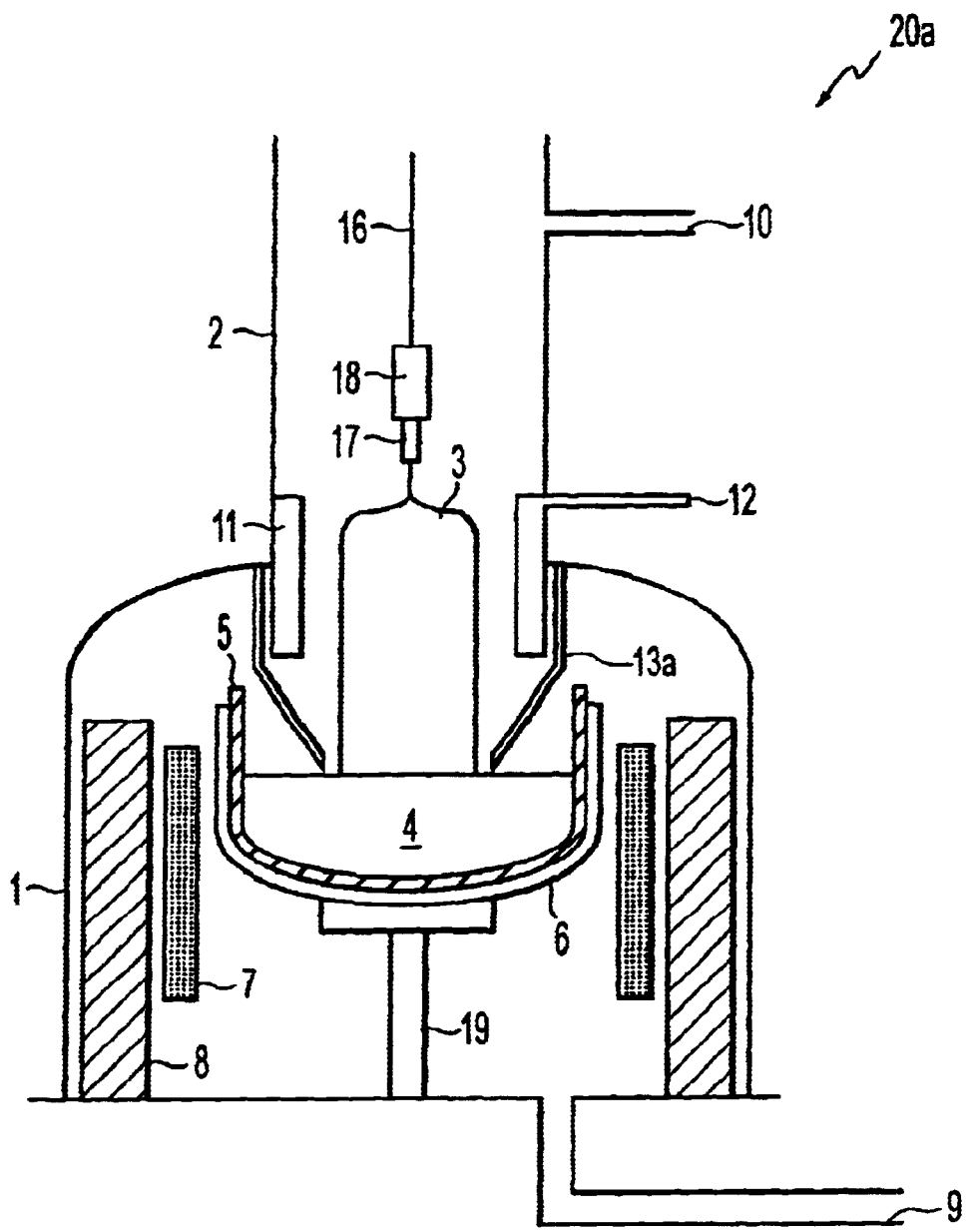
FIG. 2 is a sectional view showing a schematic structure of the second embodiment of the apparatus for growing a single crystal according to the present invention.

FIG. 2 is a sectional view showing a schematic structure of another example of the apparatus for growing a single crystal according to the present invention.

In this apparatus 20a, an auxiliary cooling member 13a extends from the ceiling of the main chamber 1 downwardly so as to surround the cooling cylinder 11, and, has a shape tapered from a position near the lower end of the cooling cylinder 11 toward the downward direction. At a position near the raw material melt surface, the end portion of the auxiliary cooling member 13a approaches the growing single crystal ingot 3. This structure prevents adhesion of the melt 4 scattering during the melting operation of the raw material and so forth to the cooling cylinder 11, and also has an advantage that it effectively shields the radiant heat from the surface of the melt 4 in addition to the radiant heat from the heater 7.

Figure 3:
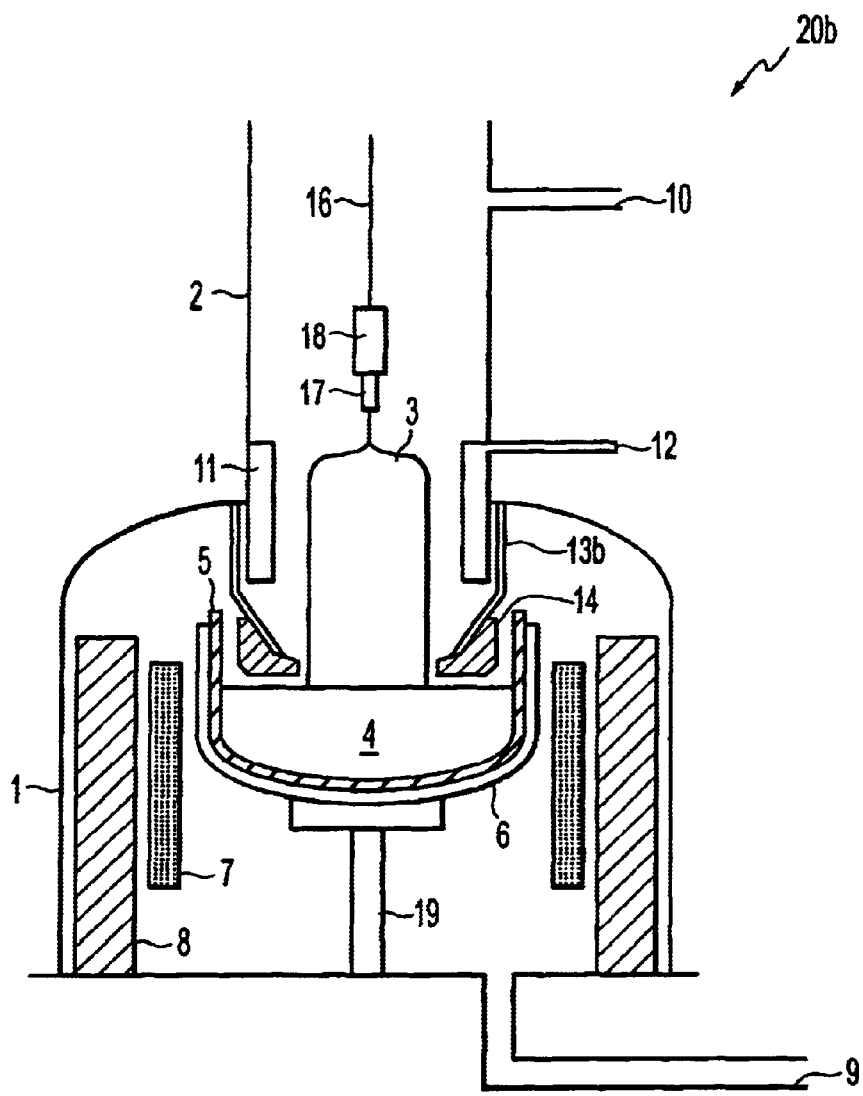
FIG. 3 is a sectional view showing a schematic structure of the third embodiment of the apparatus for growing a single crystal according to the present invention.

FIG. 3 is a sectional view showing a schematic structure of a further example of the apparatus for growing a single crystal according to the present invention.

In this apparatus 20b, a thick heat-shielding member 14 is provided at the end of the auxiliary cooling member 13b having a shape tapered from a position near the lower end of the cooling cylinder 11 toward the downward direction, as in the apparatus 20a shown in FIG. 2. By providing the heat-shielding member 14 to the auxiliary cooling member 13b, the radiant heat from the heater 7 and the melt 4 can be more effectively shielded, in particular, at a position near the melt surface at a high temperature, and therefore the growth rate can be further improved.

Material of the heat-shielding member 14 may be, in particular, one showing excellent heat resistance and having high heat conductivity and, for example, the materials exemplified as the material of the auxiliary cooling member 13b, i.e., graphite, molybdenum or tungsten, or silicon carbide, or graphite coated with silicon carbide, are preferably used. If any of such materials is used, it becomes possible to more favorably shield the radiant heat from the heater or the melt surface.

Figure 4:
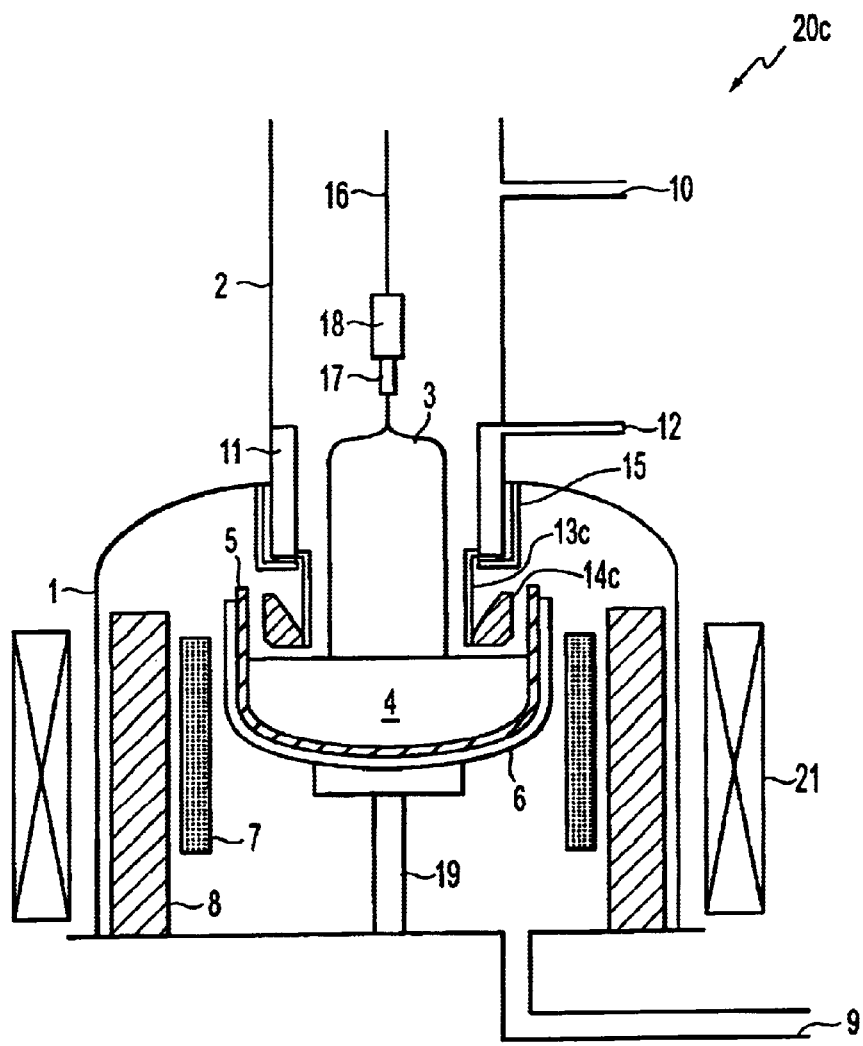
FIG. 4 is a sectional view showing a schematic structure of the fourth embodiment of the apparatus for growing a single crystal according to the present invention.

FIG. 4 is a sectional view showing a schematic structure of a further example of the apparatus for growing a single crystal according to the present invention.

In this apparatus 20c, there is disposed the cooling cylinder 11 extending from a lower position in the pulling chamber 2 into the main chamber 1 as in the apparatus 20 shown in FIG. 1. There is provided a cylindrical auxiliary cooling member 13c extending from inside of the cooling cylinder 11 at a lower position thereof to a position near the raw material melt, and a heat-shielding member 14c is provided at the periphery of the end of the auxiliary cooling member 13c.

Although the auxiliary cooling member 13c and the heat-shielding member 14c are somewhat different in their shapes respectively from those provided in the apparatuses 20, 20a and 20b shown above, the auxiliary cooling member 13c also exerts the effect of cooling the grown single crystal 3 by shielding the radiant heat from the heater 7 in the space from the neighborhood of the melt surface to the cooling cylinders 11, and the heat-shielding member 14c has surfaces facing the melt 4 and the heater 7, and can more effectively shield the radiant heat, as in the cases described above.

In the apparatus 20c shown in FIG. 4, a protection member 15 is further provided outside the cooling cylinder 11. This protection member 15 extends from the ceiling of the main chamber 1, and it is disposed so as to cover the outer surface of the cooling cylinder 11 including its end surface in the main chamber 1.

By providing such a protection member 15, adhesion of the melt 4 that may be scattered during the melting operation of the raw material and so forth to the cooling cylinder 11 can be prevented, and direct irradiation of the radiant heat from the heater and so froth to the cooling cylinder 11 can also be reduced. Thus, the heat removal effect of the cooling cylinder 11 is also improved.

As the material of the protection member 15, graphite or a metal having heat resistance can be used.

In any of the aforementioned embodiments, the end of the cooling cylinder 11 is preferably separated from the raw material melt surface by 10 cm or more. The effect of rapidly cooling the crystal is improved as the cooling cylinder 11 becomes closer to the melt surface. However, since a position near the melt surface is at a high temperature exceeding 1000° C., if the end of the cooling cylinder 11 is separated from the melt surface by a distance less than 10 cm, the cooling cylinder 11 per se will also be heated to a high temperature and there arises a possibility that the cooling cylinder 11 may be degraded and broken, for example. Further, if the distance between the cooling cylinder 11 and the melt surface is too small, the length of the auxiliary cooling member extending downwardly from the cooling cylinder 11 may become extremely short even if such a member can be provided, or it may become impossible to provide such a member. Therefore, it becomes difficult to obtain the protection effect for the cooling cylinder by the auxiliary cooling member. Accordingly, the end of the cooling cylinder 11 is preferably separated from the raw material melt surface by 10 cm or more.

Further, the cooling cylinder 11 extending from the ceiling of the main chamber 1 toward the raw material melt surface desirably has a length of 5 cm or more. If the length of the cooling cylinder 11 is less than 5 cm, it is difficult to obtain the desired cooling effect. Further, when the crystal 3 enters into the pulling chamber 2, heat removal effect by the pulling chamber 2 can be expected, and therefore the cooling cylinder 11 preferably extends from the ceiling of the main chamber 1 toward the raw material melt surface by 5 cm or more.

The distance from the ceiling of the main chamber 1 to the melt surface may vary depending on the structure of the apparatus or growing conditions of single crystal ingot, and the length of the cooling cylinder 11 itself should be determined according to the length of the chamber of the apparatus for growing a crystal and the operation conditions. However, in order to obtain the effect of the cooling cylinder 11 of the present invention, if the gap between the melt surface and the end of the cooling cylinder 11 is controlled to be 10 cm or more for the case where the length of the cooling cylinder is the longest, or the distance from the ceiling of the main chamber to the end of the cooling cylinder is controlled to be 5 cm or more for the case where the length of the cooling cylinder is the shortest, the aforementioned effect can be surely obtained.

Furthermore, by providing the cooling cylinder 11 as described above, gas flow guide effect for inert gas such as argon that is passed through the inside of the cooling cylinder 11 from above can be increased, and cooling effect by the gas can also be obtained. Moreover, a sufficient gap is secured between the end of the cooling cylinder 11 and the melt surface. As a result, it becomes possible to observe a growing portion of the single crystal ingot 3 on the melt through this gap, and thus the growing portion of the crystal ingot can be observed without any difficulty only by providing a detection window for detection of diameter or view port enabling operators to know growing status of the crystal for only the auxiliary cooling members 13, 13a, 13b or 13c. This simplifies the apparatus and provides more uniform cooling effect by the cooling cylinder.

Further, if the inner surface of the cooling cylinder 11 is subjected to a blackening treatment such as application or vapor deposition of graphite to blacken the surface thereof, heat absorption effect of the cooling cylinder 11 can be further improved, and it becomes possible to more effectively absorb the radiant heat from the grown single crystal 3. Thus, the cooling effect is improved.

Further, in the apparatus for growing a single crystal according to the present invention explained above, thermal history of the grown single crystal can be freely controlled by changing the position of the melt surface with respect to the cooling cylinder by a driving mechanism or suitably selecting the length of the auxiliary cooling member. For example, by making the cooling cylinder closer to the melt surface and simultaneously bringing the auxiliary cooling member to a position immediately above the melt surface, rapid cooling effect can be obtained. Conversely, if the cooling cylinder is made remoter from the melt surface and the auxiliary cooling member is also made remoter from the melt surface, gradual cooling effect can be obtained. Further, by making the cooling cylinder remoter from the melt surface and simultaneously bringing the auxiliary cooling member to a position immediately above the melt surface, it is also possible to control the aggregation temperature zone of crystal defects called grown-in defects and the temperature zone concerning the oxygen precipitation in the crystal to be in a desired regions Furthermore, it is of course possible to use the apparatus of the present invention in the pulling methods under magnetic field (referred to as "MCZ method" hereafter) in which an electromagnet 21 is provided outside the main chamber 1 accommodating the melt 4 as shown in FIG. 4 and the single crystal 3 is grown with application of a magnetic field, and thereby obtain a similar effect. In particular, if the apparatus of the present invention is used for an apparatus for growing a single crystal by the MCZ method for the production of a large single crystal, the crystal growth rate can be more effectively improved and therefore marked improvement of productivity can be expected.

The present invention will be explained more specifically with reference to the following working example and comparative example. However, the present invention is not limited to these.

EXAMPLE

A silicon single crystal ingot was grown by the MCZ method using the apparatus for growing a single crystal 20c shown in the FIG. 4. The material of the cooling cylinder 11 was stainless steel, and water was used as a cooling medium. The auxiliary cooling member 13c, the heat-shielding member 14c and the protection member 15 were composed of graphite material. The cooling cylinder 11 (length: 30 cm) was disposed so that its end should be separated from the melt surface by 25 cm, and the auxiliary cooling member 13c was brought to a position immediately near the melt surface to perform the operation. On the other hand, a magnetic field was applied to the silicon melt 4 so that the magnetic field strength at the center of horizontal magnetic field should be 4000 G, and a hot zone that can accommodate a crucible having a diameter of 24 inches was used.

An amount of 150 kg of polycrystal silicon raw material was introduced into the crucible having a diameter of 24 inches, and a single crystal having a diameter of 8 inches and a length of constant diameter portion of about 100 cm was grown. As a result, a silicon single crystal in an approximately cylindrical shape could be obtained at an average pulling rate of 2.0 mm/min for the constant diameter portion of the single crystal without any deformation. Then, 100 kg of the raw material was introduced into a crucible of a similar size, and a crystal having a diameter of 6 inches and a length of constant diameter portion of about 100 cm was grown. As a result, a silicon single crystal in an approximately cylindrical shape could be obtained at an average pulling rate of 2.6 mm/min for the constant diameter portion of the single crystal without any deformation.

Comparative Example

Single crystals were grown under the same conditions as the example except that used was an apparatus for growing a single crystal in which a graphite cylinder was suspended from the ceiling of the main chamber instead of the cooling cylinder of the apparatus for growing a single crystal used in the aforementioned example. The lengths of the grown single crystals were also approximately the same as the lengths pulled in the example.

As a result, although single crystals in an approximately cylindrical shape can be grown without crystal deformation at an average pulling rate of 1.4 mm/min for the constant diameter portion for a crystal having a diameter of 8 inches or 1.8 mm/min for a crystal having a diameter of 6 inches, single crystal could not normally grown at a pulling rate higher than the above level, because there were caused problems, for example, crystal was deformed during the growth, slip dislocations were generated and so forth.

Figure 5:
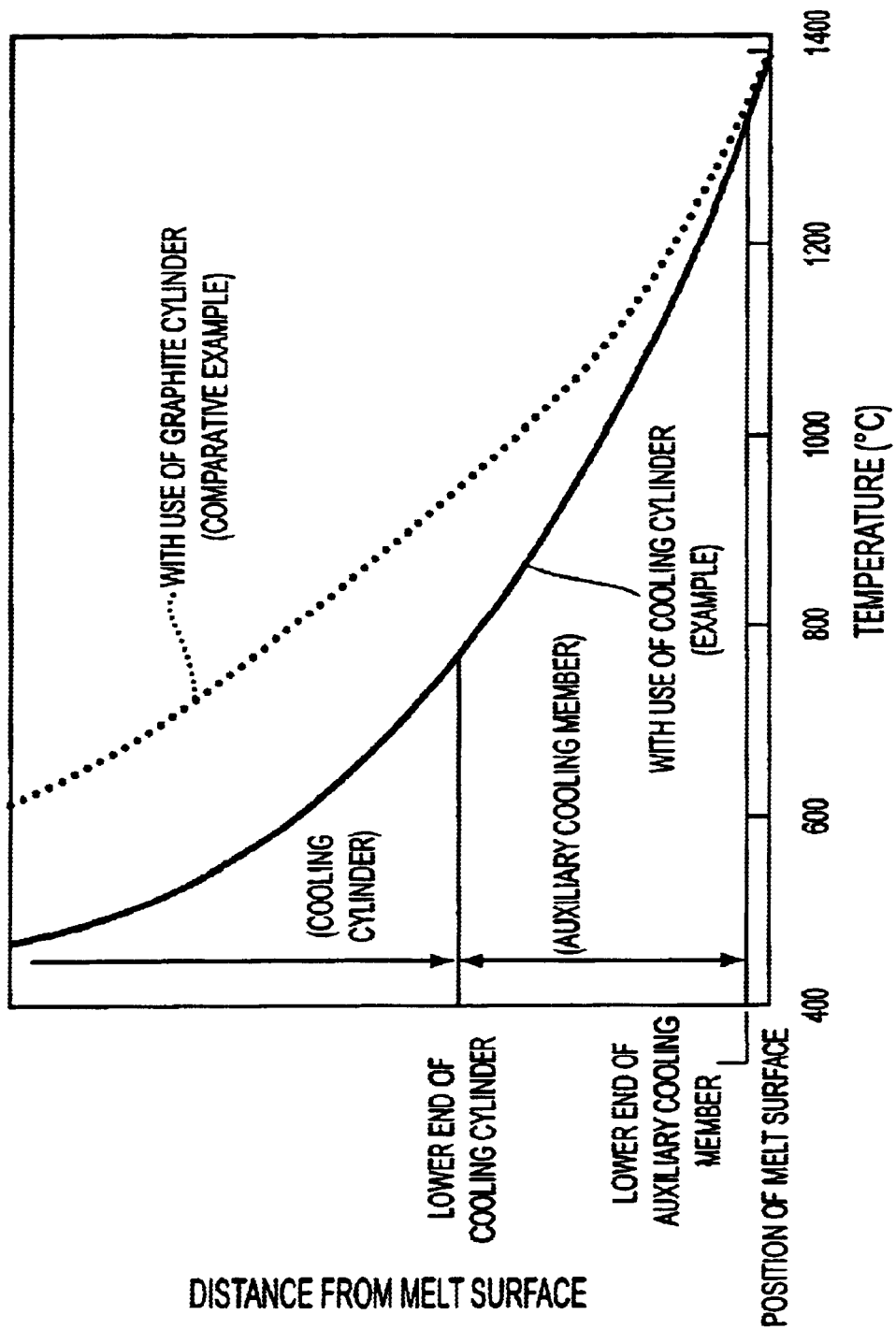
FIG. 5 is a graph showing temperature distribution along the crystal growth axis direction obtained by simulation.

To investigate the cause of these results, simulation was performed by using global heat transfer analysis software, called FEMAG (F. Dupret, P. Nicodeme, Y. Ryckmans, P. Wouters and M. J. Crochet, Int J. Heat Mass Transfer, 33, 1849 (1990)). As a result, the results shown in FIG. 5 were obtained. From the results shown in FIG. 5, it can be seen that the apparatus of the example provided with the cooling cylinder could have a more excellent apparatus structure of rapid cooling type by the effect of the cooling cylinder compared with the apparatus of the comparative example, and thus it could efficiently eliminate the heat of the grown single crystal. For confirmation, temperature distributions in the furnaces of the apparatuses of example and comparative example were determined. As a result, temperature distributions substantially same as the simulation were obtained. Therefore, by using the apparatus of the present invention, the temperature distribution in the furnace of the apparatus for growing a single crystal was changed to that of rapid cooling type by the use of the apparatus of the present invention and the cooling rate of the crystal was increased. As a result, the increase of the pulling rate was attained.

The present invention is not limited to the embodiments described above. The above-described embodiments are mere examples, and those having the substantially same structure as that described in the appended claims and providing similar functions and advantages are included in the scope of the present invention.

For example, while the apparatus of the present invention was explained by exemplifying an apparatus for growing a single crystal by the CZ method in which a single crystal is grown without applying a magnetic field and an apparatus for growing a single crystal by the HMCZ method in which a single crystal is grown with applying a horizontal magnetic field to the melt, similar effect can of course be obtained in apparatuses for growing a single crystal utilizing other magnetic fields including cusp magnetic field, vertical magnetic field and so forth.

What is claimed is:

1. An apparatus for growing a single crystal comprising:

a main chamber enclosing a crucible for accommodating a raw material melt;

a heater for heating the raw material melt;

a pulling chamber continuously provided above the main chamber, into which a grown single crystal is pulled and stored, a cooling cylinder that extends at least from a ceiling of the main chamber toward a raw material melt surface, so as to surround a single crystal under pulling, the cooling cylinder being forcibly cooled with a cooling medium; and an auxiliary cooling member extending below the cooling cylinder and having a cylindrical shape or a shape tapered toward the downward direction.

2. The apparatus for growing a single crystal according to claim 1, wherein the cooling cylinder is composed of iron, nickel, chromium, copper, titanium, molybdenum, tungsten or an alloy containing any one of these metals, or any of the metals and alloy coated with titanium, molybdenum, tungsten or a platinum metal.

3. The apparatus for growing a single crystal according to claim 2, wherein an end of the cooling cylinder is separated from the surface of the raw material melt contained in the crucible by 10 cm or more.

4. The apparatus for growing a single crystal according to claim 2, wherein a protection member consisting of graphite or metal is provided outside the cooling cylinder.

5. The apparatus for growing a single crystal according to claim 4, wherein an inner surface of the cooling cylinder is subjected to a blackening treatment.

6. The apparatus for growing a single crystal according to claim 2, wherein an inner surface of the cooling cylinder is subjected to a blackening treatment.

7. The apparatus for growing a single crystal according to claim 1, wherein the auxiliary cooling member consists of graphite, molybdenum or tungsten.

8. The apparatus for growing a single crystal according to claim 7, wherein a heat-shielding member is provided to the auxiliary cooling member.

9. The apparatus for growing a single crystal according to claim 1, wherein a heat-shielding member is provided to the auxiliary cooling member.

10. The apparatus for growing a single crystal according to claim 1, wherein an end of the cooling cylinder is separated from the surface of the raw material melt contained in the crucible by 10 cm or more.

11. The apparatus for growing a single crystal according to claim 1, wherein a protection member consisting of graphite or metal is provided outside the cooling cylinder.

12. The apparatus for growing a single crystal according to claim 11, wherein an inner surface of the cooling cylinder is subjected to a blackening treatment.

13. The apparatus for growing a single crystal according to claim 1, wherein an inner surface of the cooling cylinder is subjected to a blackening treatment.

14. A method for producing a single crystal, comprising rowing a single crystal using an apparatus for growing a single crystal according to claim 1.

15. A single crystal, wherein it is grown by using an apparatus for growing a single crystal according to claim 1.

* * * * *